(12) United States Patent
Jin et al.

(10) Patent No.: US 9,335,591 B2
(45) Date of Patent: May 10, 2016

(54) ARRAY SUBSTRATE, DISPLAY PANEL AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Huijun Jin, Shanghai (CN); Zhaokeng Cao, Shanghai (CN); Yao Lin, Shanghai (CN); Yansong Li, Shanghai (CN); Miaomiao Wang, Shanghai (CN)

(73) Assignees: Shanghai AVIC Optoelectronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/562,758

(22) Filed: Dec. 7, 2014

(65) Prior Publication Data

US 2016/0070144 A1    Mar. 10, 2016

(30) Foreign Application Priority Data

Sep. 9, 2014   (CN) .......................... 2014 1 0455901

(51) Int. Cl.

| | | |
|---|---|---|
| *G02F 1/1337* | (2006.01) | |
| *G02F 1/1343* | (2006.01) | |
| *H01L 27/12* | (2006.01) | |
| *H01L 29/40* | (2006.01) | |
| *H01L 29/786* | (2006.01) | |

(52) U.S. Cl.
CPC ...... *G02F 1/134336* (2013.01); *G02F 1/13439* (2013.01); *G02F 1/133707* (2013.01); *H01L 27/124* (2013.01); *H01L 29/40* (2013.01); *H01L 29/786* (2013.01); *G02F 2001/134345* (2013.01)

(58) Field of Classification Search
CPC .................... G02F 1/134336; G02F 1/136286; G02F 1/133707
See application file for complete search history.

(56) References Cited

U.S. PATENT DOCUMENTS

| | | | |
|---|---|---|---|
| 7,259,812 B2 | 8/2007 | Park et al. | |
| 7,317,503 B2 * | 1/2008 | Lee .................... | G02F 1/134363 349/141 |
| 8,049,855 B2 * | 11/2011 | Tanaka .............. | G02F 1/134363 349/141 |
| 8,253,884 B2 * | 8/2012 | Miyachi ................. | C09K 19/18 349/132 |
| 8,982,309 B2 * | 3/2015 | Jang .................. | G02F 1/134309 349/106 |
| 2004/0227890 A1 | 11/2004 | Chung et al. | |
| 2004/0263748 A1 | 12/2004 | Park et al. | |
| 2005/0140907 A1 | 6/2005 | Yun | |
| 2009/0009671 A1 | 1/2009 | Wakabayashi | |

FOREIGN PATENT DOCUMENTS

| | | |
|---|---|---|
| JP | 2013117674 A | 6/2013 |
| KR | 20120130582 A | 12/2003 |

* cited by examiner

*Primary Examiner* — Phu Vu
(74) *Attorney, Agent, or Firm* — Faegre Baker Daniels LLP

(57) ABSTRACT

An array substrate including a plurality of pixel units each including a 2×2 sub-pixel area matrix, where each of the sub-pixel areas includes three sub-pixel electrodes. The strip electrode of at least one of the sub-pixel electrodes from each of the first sub-pixel area and the third sub-pixel area is parallel to a first direction, and the strip electrode of at least one of the sub-pixel electrodes from each of the second sub-pixel area and the fourth sub-pixel area is parallel to a second direction. The first direction intersects with the second direction. Also, a first area is defined by the sub-pixel electrodes including the strip electrodes parallel to the first direction and the sub-pixel electrodes including the strip electrodes parallel to the second direction, and the first area is provided with a sub-pixel electrode.

17 Claims, 12 Drawing Sheets

ARRAY SUBSTRATE, DISPLAY PANEL AND DISPLAY DEVICE

CROSS-REFERENCE TO RELATED APPLICATION

This application claims priority to Chinese Application No. 201410455901.X filed on Sep. 9, 2014, entitled "Array Substrate, Display Panel And Display Device", the disclosure of which is incorporated herein by reference in its entirety.

BACKGROUND

Due to their advantages such as light weight, small thickness, low power consumption and low radiation, liquid crystal display devices have been widely used in various fields. With the development of liquid crystal display technologies, the liquid crystal display devices have continually improved display effects.

In some liquid crystal display devices, strip electrodes from rows of pixel electrodes on the array substrate are arranged in a pseudo dual-domain structure, such that for the strip electrodes from any two adjacent rows of pixel electrodes, the strip electrodes from one of the two adjacent rows of pixel electrodes are parallel with a first direction that is different from a second direction with which the strip electrodes from the other one of the two adjacent rows of pixel electrodes are parallel. In the process of manufacturing the liquid crystal display device, if a rubbing orientation direction is deviated in rubbing or a polarizer is deviated in adhering, then luminance corresponding to odd rows of pixel electrodes and luminance corresponding to even rows of pixel electrodes are uneven while displaying, thereby generating transverse striations in the liquid crystal display device.

SUMMARY

The embodiments of the disclosure provide an array substrate, a display panel and a display device, which solve the problem that when a rubbing orientation direction is deviated in rubbing or a polarizer is deviated in adhering the luminance corresponding to odd rows of pixel electrodes and luminance corresponding to even rows of pixel electrodes are uneven while displaying thereby generating transverse striations in the liquid crystal display device.

Embodiments of the disclosure provides an array substrate, including: a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence; wherein each of the sub-pixel areas comprises three sub-pixel electrodes;

each of the sub-pixel electrodes comprises a strip electrode;

the strip electrode of at least one of the sub-pixel electrodes from each of the first sub-pixel area and the third sub-pixel area is parallel to a first direction;

the strip electrode of at least one of the sub-pixel electrodes from each of the second sub-pixel area and the fourth sub-pixel area is parallel to a second direction;

the first direction intersects with the second direction, to form an angle larger than 0° and smaller than or equal to 90° between the first direction and the second direction;

wherein, a first area is defined by the sub-pixel electrodes comprising the strip electrodes parallel to the first direction and the sub-pixel electrodes comprising the strip electrodes parallel to the second direction, and is provided with a sub-pixel electrode.

Some embodiments of the disclosure provide a display panel, including: a first substrate, a second substrate, and a liquid crystal layer located between the first substrate and the second substrate, wherein, the first substrate includes the above array substrate.

Some embodiments of the disclosure provide a display device, including the above display panel.

With the array substrate, the display panel and the display device according to the embodiments of the disclosure, each row of the sub-pixel electrodes include both strip electrodes parallel to the first direction and strip electrodes parallel to the second direction, such that, if the rubbing orientation direction is deviated in rubbing or the polarizer is deviated in adhering, high luminance and low luminance corresponding to sub-pixel electrodes in each row of sub-pixel electrodes on the array substrate alternate and no distinct luminance difference is present between the odd and even rows of sub-pixel electrodes, thereby avoiding the problem of the transverse striation.

While multiple embodiments are disclosed, still other embodiments will become apparent to those skilled in the art from the following detailed description, which shows and describes illustrative embodiments. Accordingly, the drawings and detailed description are to be regarded as illustrative in nature and not restrictive.

Figure 1A:
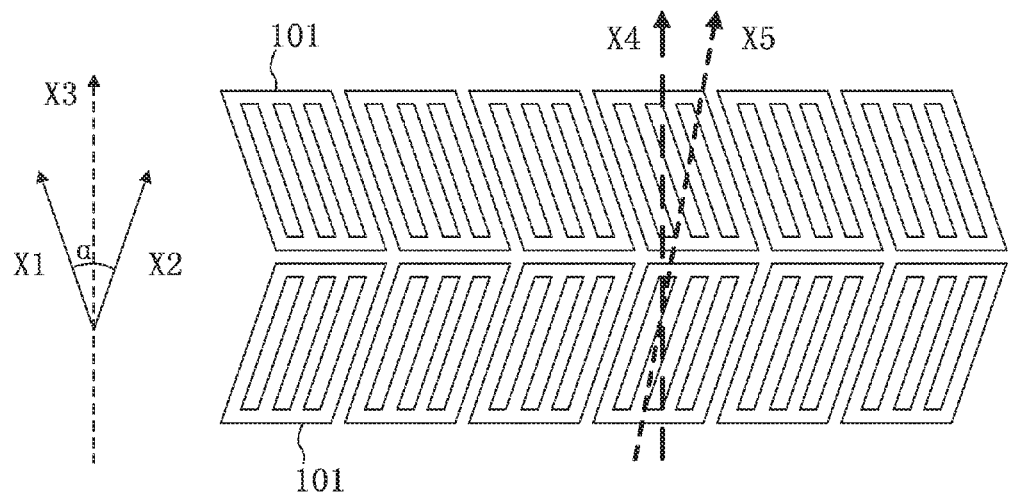
FIG. 1A is a schematic diagram of the structure of pixel electrodes in the related art.

Embodiments have been shown by way of example in the drawings and are described in detail below. The intention is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The present disclosure will be further described in conjunction with the accompanying drawings and specific embodiments. It is to be understood that, the specific embodiments described herein are intended to explain the present disclosure, but not to limit the present disclosure. Also, it is further noted that the drawings only show parts relevant to the present disclosure rather than all contents of the disclosure for ease of description.

In a liquid crystal display device, an electric field formed between a pixel electrode and a common electrode is used to control rotation of liquid crystal molecules and to achieve a display effect of the liquid crystal display device. Thus, an arrangement pattern of strip electrodes from each row of pixel electrodes may affect the electric field formed between the pixel electrodes and the common electrode, thereby affecting rotation of the liquid crystal molecules and the display effect of the liquid crystal display device.

FIG. 1A is a schematic diagram of the structure of pixel electrodes in the related art. Referring to FIG. 1A, among any two adjacent rows of pixel electrodes 101 on an array substrate in the liquid crystal display device, a first row of pixel electrodes 101 (which is an odd or even row of pixel electrodes on the array substrate) includes strip electrodes all parallel to a first direction X1, a second row of pixel electrodes 101 (which is an even row or odd row of pixel electrodes on the array substrate) includes strip electrodes all parallel to a second direction X2, and an angle between the first direction X1 and the second direction X2 is α, thereby forming the pseudo dual-domain structure of the arrangement of the strip electrodes in the related art. Additionally, as shown in FIG. 1A, a dashed line X3 with an arrow represents the direction of angle bisector of the angle α, and the pixel electrodes in the same column on the array substrate have the same color (not shown), and hence all may be red pixel electrodes, green pixel electrodes, blue pixel electrodes or white pixel electrodes, for example.

For the arrangement pattern of the strip electrodes from each row of pixel electrodes 101 in FIG. 1A, the rubbing orientation direction as well as a polarization direction of the polarizer are required to be consistent with the direction X3 of angle bisector of the angle α in manufacturing the liquid crystal display device, in order to ensure a good display effect. If the polarizer is deviated in adhering, the polarization direction of the polarizer is inconsistent with the direction X3 of angle bisector of the angle α. As shown in FIG. 1A, the direction X3 of angle bisector of the angle α is consistent with a rubbing orientation direction X4, but is inconsistent with the polarization direction X5 of the polarizer, i.e., an angle formed between the polarization direction X5 and the first direction X1 is unequal to an angle formed between the polarization direction X5 and the second direction X2, so that a polarization angle of lights through the odd row of pixels on the array substrate is unequal to a polarization angle of lights through the even row of pixels on the array substrate; on the other hand, if the rubbing orientation direction is deviated in rubbing, the rubbing orientation direction is inconsistent with the direction X3 of angle bisector of the angle α, so that the initial deflection angle of the liquid crystal molecules above the odd rows of pixel electrodes is unequal to the initial deflection angle of the liquid crystal molecules above the even rows of pixel electrodes, on the array substrate. As such, during operation of the liquid crystal display device, when the odd rows of pixel electrodes in the liquid crystal display device correspond to low (or high) luminance, the even rows of pixel electrodes in the liquid crystal display device correspond to high (or low) luminance, i.e. the luminance corresponding to the odd rows of pixel electrodes in the liquid crystal display device is different from the luminance corresponding to the even rows of pixel electrodes in the liquid crystal display device, thereby generating transverse striations in the liquid crystal display device.

Based on the above description, embodiments of the disclosure provide the following technical solutions.

Figure 1B:
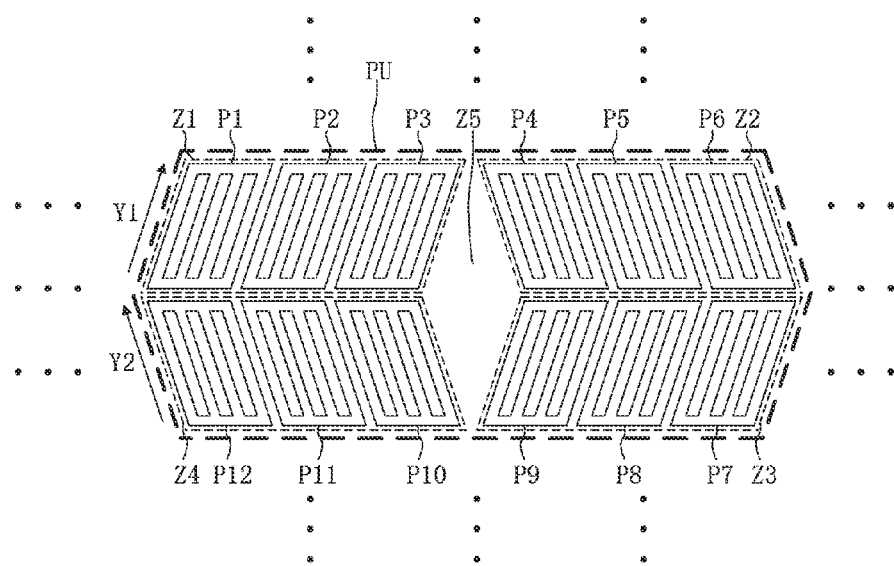
FIG. 1B is a schematic diagram of the structure of an array substrate according to some embodiments of the disclosure.

FIG. 1B is a schematic diagram showing the structure of an array substrate according to embodiments of the disclosure. Referring to FIG. 1B, the array substrate includes a plurality of pixel units PU each including a 2×2 sub-pixel area matrix, with the 2×2 sub-pixel area matrix including a first sub-pixel area Z1, a second sub-pixel area Z2, a third sub-pixel area Z3, and a fourth sub-pixel area Z4 arranged in sequence; each of the sub-pixel areas includes three sub-pixel electrodes each including a strip electrode; the strip electrode of at least one of the sub-pixel electrodes from each of the first sub-pixel area Z1 and the third sub-pixel Z3 is parallel to a first direction Y1; the strip electrode of at least one of the sub-pixel electrodes from each of the second sub-pixel area Z2 and the fourth sub-pixel Z4 is parallel to a second direction Y2; the first direction Y1 intersects with the second direction Y2 to form an angle larger than 0° and smaller than or equal to 90° between the first direction Y1 and the second direction Y2, for example in FIG. 1B, the angle formed between the first direction Y1 and the second direction Y2 is larger than 0° and smaller than 90°; where, a first area Z5 is defined by the sub-pixel electrodes including the strip electrodes parallel to the first direction Y1 and the sub-pixel electrodes including the strip electrodes parallel to the second direction Y2, and is provided with a sub-pixel electrode (not shown).

In FIG. 1B, the first sub-pixel area Z1, the second sub-pixel area Z2, the third sub-pixel area Z3 and the fourth sub-pixel area Z4 in the pixel unit PU are arranged clockwise in sequence, and the strip electrode of all of sub-pixel electrodes from each of the first sub-pixel area Z1 and the third sub-pixel Z3 is parallel to the first direction Y1; the strip electrode of all of the sub-pixel electrodes from each of the second sub-pixel area Z2 and the fourth sub-pixel Z4 is parallel to the second direction Y2; and the pixel unit PU includes a first area Z5. The pixel unit PU further includes a first sub-pixel electrode P1, a second sub-pixel electrode P2, a third sub-pixel electrode P3, a fourth sub-pixel electrode P4, a fifth sub-pixel electrode P5, a sixth sub-pixel electrode P6, a seventh sub-pixel electrode P7, an eighth sub-pixel electrode P8, a ninth sub-pixel electrode P9, a tenth sub-pixel electrode P10, an eleventh sub-pixel electrode P11 and a twelfth sub-pixel electrode P12 arranged clockwise in sequence, where, the first sub-pixel electrode P1, the second sub-pixel electrode P2 and the third sub-pixel electrode P3 are located within the first sub-pixel area Z1, the fourth sub-pixel electrode P4, the fifth sub-pixel electrode P5 and the sixth sub-pixel electrode P6 are located within the second sub-pixel area Z2, the seventh sub-pixel electrode P7, the eighth sub-pixel electrode P8 and the ninth sub-pixel electrode P9 are located within the third sub-pixel area Z3, and the tenth sub-pixel electrode P10, the eleventh sub-pixel electrode P11 and the twelfth sub-pixel electrode P12 are located within the fourth sub-pixel area Z4.

It is noted that FIG. 1B is an example of the array substrate of the present disclosure, and the clockwise or anticlockwise arrangement pattern of the four sub-pixel areas in the pixel unit on the array substrate, the number of the sub-pixel electrodes respectively including strip electrodes parallel to the first direction Y1 and the second direction Y2, etc., are not limited herein.

Since the first sub-pixel area, the second sub-pixel area, the third sub-pixel area and the fourth sub-pixel area are arranged in sequence, the first sub-pixel area and the third sub-pixel area are located at different rows, and the second sub-pixel area and the fourth sub-pixel are located at different rows. Further, considering that each of the sub-pixel areas includes three sub-pixel electrodes each including a strip electrode, the strip electrode of at least one of the sub-pixel electrodes from each of the first sub-pixel area and the third sub-pixel is parallel to a first direction, and the strip electrode of at least one of the sub-pixel electrodes from each of the second sub-pixel area and the fourth sub-pixel is parallel to a second direction, not all the strip electrodes of the sub-pixel electrodes from the same row of sub-pixel electrodes in the pixel unit are parallel to the first direction or the second direction, but a part of the strip electrodes of all the sub-pixel electrodes from the same row of sub-pixel electrodes are parallel to the first direction and the remaining of the strip electrodes of all the sub-pixel electrodes from the same row of sub-pixel electrodes are parallel to the second direction.

If the rubbing orientation direction is deviated in rubbing, the rubbing orientation direction is inconsistent with the direction of angle bisector of the angle between the first direction and the second direction, that is, the initial deflection angle of the liquid crystal molecules above the strip electrodes parallel to the first direction is unequal to the initial deflection angle of the liquid crystal molecules above the strip electrodes parallel to the second direction; on the other hand, if the polarizer is deviated in adhering, and hence the polarization direction of the polarizer is inconsistent with the direction of angle bisector of the angle between the first direction and the second direction, a polarization angle of lights through the strip electrodes parallel to the first direction is unequal to a polarization angle of lights through the strip electrodes parallel to the second direction. For both of the above cases, when the sub-pixel electrode including the strip electrode parallel to the first direction corresponds to high luminance, the sub-pixel electrode including the strip electrode parallel to the second direction corresponds to low luminance. However, according to the arrangement pattern of the strip electrodes in each row of sub-pixel electrodes as provided by the present disclosure, each row of sub-pixel electrodes include both the strip electrodes parallel to the first direction and the strip electrodes parallel to the second direction. If the rubbing orientation direction is deviated in rubbing or the polarizer is deviated in adhering, then high luminance and low luminance corresponding to the sub-pixel electrodes from each row of sub-pixel electrodes alternate, that is, the high luminance and low luminance corresponding to the sub-pixel electrodes from either of the odd and even rows of sub-pixel electrodes on the array substrate alternate, so that no distinct luminance difference is present between the odd and even rows of sub-pixel electrodes. In comparison, with the existing arrangement pattern of the strip electrodes which causes a distinct difference between luminance corresponding to the odd row of sub-pixel electrodes and the luminance corresponding to the even row of sub-pixel electrodes when the rubbing orientation direction is deviated in rubbing or the polarizer is deviated in adhering, the technical solutions of the present disclosure can avoid the problem of the transverse striations present in the related art. It is noted that in the technical solutions of the present disclosure, since two adjacent sub-pixel electrodes in the same column have strip electrodes parallel with different directions, the effect that high and low luminance corresponding to the sub-pixel electrodes in the same column alternate is achieved as well, thereby avoiding the vertical striation.

With the above arrangement pattern of the strip electrodes in each row of sub-pixel electrodes, where strip electrodes are parallel to the first direction and strip electrodes are parallel to the second direction, the problem of the transverse striation in the related art is solved. However, considering a blank area, i.e. the first area of the present disclosure, which is defined by the sub-pixel electrodes including the strip electrodes parallel to the first direction and the sub-pixel electrodes including the strip electrodes parallel to the second direction, the transmittance of the blank area is different from the transmittance of the area provided with the sub-pixel electrodes, so that the display of the array substrate can be affected. In order to avoid negative effects on the display, a sub-pixel electrode, which can be driven together with each of the sub-pixel electrodes around the first area, is provided in the first area, thereby both effectively utilizing the first area and ensuring a good display by the array substrate.

With the array substrate according to some embodiments of the disclosure, each row of the sub-pixel electrodes include both strip electrodes parallel to the first direction and strip electrodes parallel to the second direction, if the rubbing orientation is deviated in rubbing or the polarizer is deviated in adhering, the high luminance and low luminance corresponding to sub-pixel electrodes from each row of sub-pixel electrodes on the array substrate alternate, so that no distinct luminance difference is present between the odd and even rows of sub-pixel electrodes, thereby avoiding the problem of the transverse striation.

Figure 1C:
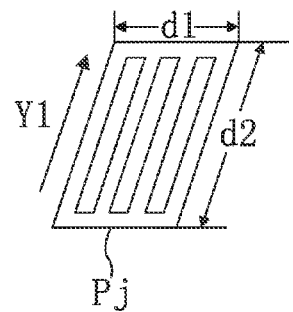
FIG. 1C is a schematic diagram of the structure of a sub-pixel electrode according to some embodiments of the disclosure.
Figure 1D:
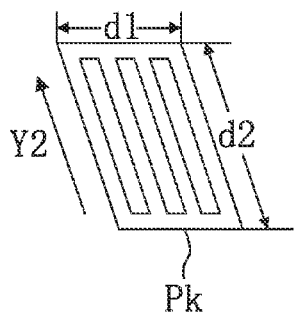
FIG. 1D is a schematic diagram of the structure of another sub-pixel electrode according to some embodiments of the disclosure.

In an implementation of the above embodiment, all the sub-pixel electrodes from the four sub-pixel areas have the same length; at least one of the sub-pixel electrodes from each of the first sub-pixel area and the third sub-pixel area is parallel to a first direction; and at least one of the sub-pixel electrodes from each of the second sub-pixel area and the fourth sub-pixel area is parallel to a second direction; and the pixel unit includes at least one first area having a parallelogram shape. For example, referring to FIG. 1C, a sub-pixel electrode Pj parallel to the first direction Y1 may be located within the first sub-pixel area or the third sub-pixel area, and the sub-pixel electrode Pj has a width of d1 and a length of d2; referring to FIG. 1D, a sub-pixel electrode Pk parallel to the second direction Y2 may be located within the second sub-pixel area or the fourth sub-pixel area, and the sub-pixel electrode Pk has a width of d1 and a length of d2. It is noted that, on the basis that the strip electrode of at least one of the sub-pixel electrodes from each of the first sub-pixel area and the third sub-pixel area is parallel to the first direction and the strip electrode of at least one of the sub-pixel electrodes from each of the second sub-pixel area and the fourth sub-pixel area is parallel to the second direction, at least one of the sub-pixel electrodes from each of the first sub-pixel area and the third sub-pixel area is further parallel to the first direction and at least one of the sub-pixel electrodes from each of the second sub-pixel area and the fourth sub-pixel area is parallel to the second direction, so that the first area defined by the sub-pixel electrodes parallel to the first direction and the sub-pixel electrodes parallel to the second direction may have a larger space, thereby making the provision of the sub-pixel electrodes in the first area easier.

Since the sub-pixel electrode is of a parallelogram shape, the first area defined by the sub-pixel electrodes is also of a parallelogram shape. It is noted that although a certain distance is present between the adjacent sub-pixel electrodes defining the first area, such distance can be ignored in comparison with the side length of the sub-pixel electrode, and thus the shape of the first area may be considered as an approximate parallelogram shape. Additionally, the first area with the parallelogram shape may be defined by the sub-pixel electrodes in the same pixel unit, or may also be defined by the sub-pixel electrodes from the adjacent pixel units. Since the configuration of the first area defined by the sub-pixel electrodes from the adjacent pixel units and hence the sub-pixel electrodes in the first area is the same as the configuration of the first area defined by the sub-pixel electrodes in the same pixel unit and hence the sub-pixel electrode in the first area, only the configuration of the first area defined by the sub-pixel electrodes in the same pixel unit and hence the sub-pixel electrodes in the first area is illustrated in the following embodiments of the disclosure.

In the above embodiment, the sub-pixel electrodes in the first area may be embodied as any one of a red sub-pixel electrode, a green sub-pixel electrode, a blue sub-pixel electrode and a white sub-pixel electrode. It is noted that the white sub-pixel electrodes may be provided in all the first areas on the array substrate. However, if the red sub-pixel electrodes, the green sub-pixel electrodes and the blue sub-pixel electrodes are provided in all the first areas on the array substrate, preferably the red sub-pixel electrodes, the green sub-pixel electrodes and the blue sub-pixel electrodes are distributed evenly and alternately in the first areas on the array substrate. For example, if the red sub-pixel electrodes are provided in a first area on the array substrate, then the green sub-pixel electrodes and the blue sub-pixel electrodes are provided in first areas located in the same row with and adjacent to the corresponding one of both sides of the first area, respectively; and similarly, the green sub-pixel electrodes and the blue sub-pixel electrodes are provided in first areas located in the same column and adjacent to the corresponding one of both sides of the first area provided with the red sub-pixel electrodes, respectively, so that color of the whole array substrate is distributed more uniformly in displaying.

Based on the above principle, the structure of the array substrate, such as the arrangement pattern of the strip electrodes from each row of the sub-pixel electrodes in the pixel unit as well as configuration of the corresponding sub-pixel switches, data lines and gate lines, etc., can be achieved by various implementations, as long as the problem of the transverse striation may be avoided when the rubbing orientation direction is deviated in rubbing or the polarizer is deviated in adhering. Embodiments are illustrated below.

In the pixel unit shown in FIG. 1B, the strip electrode of all of the sub-pixel electrodes from each of the first sub-pixel area Z1 and the third sub-pixel Z3 is parallel to the first direction Y1, and the strip electrode of all of the sub-pixel electrodes from each of the second sub-pixel area Z2 and the fourth sub-pixel Z4 is parallel to the second direction Y2. With such pixel units, the number of the sub-pixel electrodes including the strip electrode parallel to the first direction Y1 is equal to the number of the sub-pixel electrodes including the strip electrode parallel to the second direction Y2 in the same row of sub-pixel electrodes. If the rubbing orientation direction is deviated in rubbing or the polarizer is deviated in adhering, then the high luminance and the low luminance corresponding to the sub-pixel electrodes from the same row of sub-pixel electrodes is distributed in an even alternating way; further, strip electrodes in the two adjacent sub-pixel electrodes from the same column are parallel with different directions, so that the high luminance and low luminance corresponding to sub-pixel electrodes in the same column is distributed in an even alternating way, thereby avoiding the problem of the vertical striation. Therefore, the luminance corresponding to sub-pixel electrodes from each row of sub-pixel electrodes on the array substrate is evenly distributed, thereby properly avoiding the transverse striation in the related art.

The pixel unit shown in FIG. 1B is one example. In another example, it is possible that the strip electrode of each of the sub-pixel electrodes from the first sub-pixel area Z1 is parallel to the first direction Y1, but the strip electrode of only one or two of the three sub-pixel electrodes from the third sub-pixel area Z3 is parallel to the first direction Y1; and, the strip electrode of only one or two of the three sub-pixel electrodes from the second sub-pixel area Z2 is parallel to the second direction Y2, but the strip electrode of each of the sub-pixel electrodes from the fourth sub-pixel area Z4 is parallel to the second direction Y2. For example, referring to FIG. 2A, the strip electrodes of the first sub-pixel electrode P1, the second sub-pixel electrode P2, the third sub-pixel electrode P3 and the ninth sub-pixel electrode P9 are parallel to the first direction Y1, and the strip electrodes of the fourth sub-pixel electrode P4, the tenth sub-pixel electrode P10, the eleventh sub-pixel electrode P11 and the twelfth sub-pixel electrode P12 are parallel to the second direction Y2; further, the strip electrodes of both the fifth sub-pixel electrode P5 and the sixth sub-pixel electrode P6 are parallel to the first direction Y1, and the strip electrodes of both the seventh sub-pixel electrode P7 and the eighth sub-pixel electrode P8 are parallel to the second direction Y2, and the first area Z5 is formed accordingly; or alternatively, referring to FIG. 2B which is different from FIG. 2A, the strip electrodes of the eighth sub-pixel electrode P8 and the ninth sub-pixel electrode P9 are parallel to the first direction Y1, and the strip electrodes of both the fourth sub-pixel electrode P4 and the fifth sub-pixel electrode P5 are parallel to the second direction Y2; further, the strip electrodes of the sixth sub-pixel electrode P6 is parallel to the first direction Y1, and the strip electrodes of the seventh sub-pixel electrode P7 is parallel to the second direction Y2.

Additionally, it is also possible that the strip electrode of only one or two of the three sub-pixel electrodes from the first sub-pixel area Z1 is parallel to the first direction Y1, the strip electrode of each of the sub-pixel electrodes from the third sub-pixel area Z3 is parallel to the first direction Y1, and the strip electrode of each of the sub-pixel electrodes from the second sub-pixel area Z2 is parallel to the second direction Y2, and the strip electrode of only one or two of three the sub-pixel electrodes from the fourth sub-pixel area Z4 is parallel to the second direction Y2. For example, referring to FIG. 2C, the strip electrodes of the third sub-pixel electrode P3, the seventh sub-pixel electrode P7, the eighth sub-pixel electrode P8 and the ninth sub-pixel electrode P9 are parallel to the first direction Y1, and the strip electrodes of the fourth sub-pixel electrode P4, the fifth sub-pixel electrode P5, the sixth sub-pixel electrode P6 and the tenth sub-pixel electrode P10 are parallel to the second direction Y2; further, the strip electrodes of both the first sub-pixel electrode P1 and the second sub-pixel electrode P2 are parallel to the second direction Y2, the strip electrodes of both the eleventh sub-pixel electrode P11 and the twelfth sub-pixel electrode P12 are parallel to the first direction Y1, and the first area Z5 is formed accordingly; or alternatively, referring to FIG. 2D which is different from FIG. 2C, the strip electrodes of both the second sub-pixel electrode P2 and the third sub-pixel electrode P3 are parallel to the first direction Y1, and the strip electrodes of both the tenth sub-pixel electrode P10 and the eleventh sub-pixel electrode P11 are parallel to the second direction Y2; further, the strip electrode of the first sub-pixel electrode P1 is parallel to the second direction Y2, and the strip electrode of the twelfth sub-pixel electrode P12 is parallel to the first direction Y1, and the first area Z5 is formed accordingly.

Figure 3A:
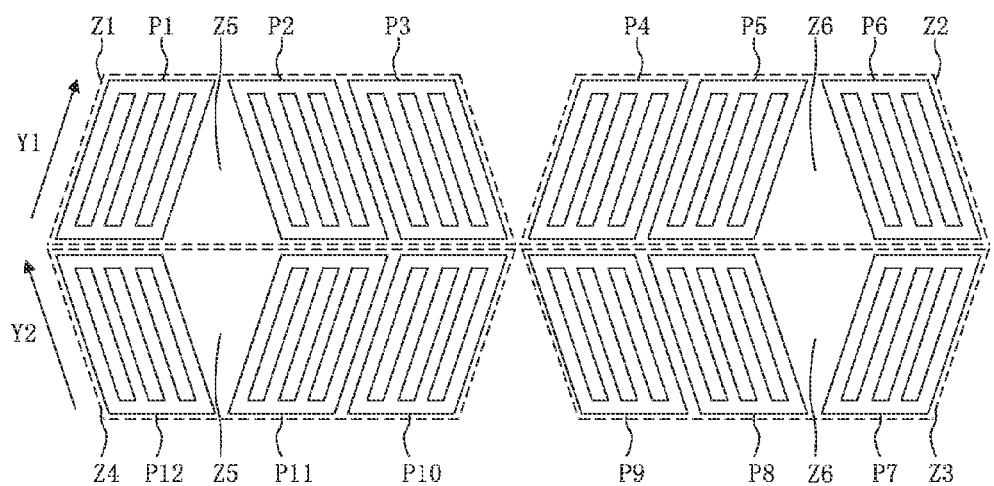
FIG. 3A is a schematic diagram of the structure of a pixel unit according to some embodiments of the disclosure.

FIG. 3A is a schematic diagram showing the structure of a pixel unit according to some embodiments of the disclosure. Referring to FIG. 3A, a pixel unit on the array substrate is such that each of the four sub-pixel areas includes three sub-pixel electrodes arranged in a 1×3 sub-pixel electrode matrix; the strip electrode of one of the sub-pixel electrodes from each of the first sub-pixel area Z1 and the third sub-pixel area Z3 is parallel to the first direction; and the strip electrode of one of the sub-pixel electrodes from each of the second sub-pixel area Z2 and the fourth sub-pixel area Z4 is parallel to the second direction Y2; and the pixel unit includes two first areas (Z5 and Z6).

Referring to FIG. 3A, the strip electrodes of both the first sub-pixel electrode P1 and the seventh sub-pixel electrode P7 are parallel to the first direction Y1, and the strip electrodes of both the sixth sub-pixel electrode P6 and the twelfth sub-pixel electrode P12 are parallel to the second direction Y2; further, the strip electrodes of the second sub-pixel electrode P2, the third sub-pixel electrode P3, the eighth sub-pixel electrode P8 and the ninth sub-pixel electrode P9 are parallel to the second direction Y2, and the strip electrodes of the fourth sub-pixel electrode P4, the fifth sub-pixel electrode P5, the tenth sub-pixel electrode P10 and the eleventh sub-pixel electrode P11 are parallel to the first direction Y1.

Figure 3B:
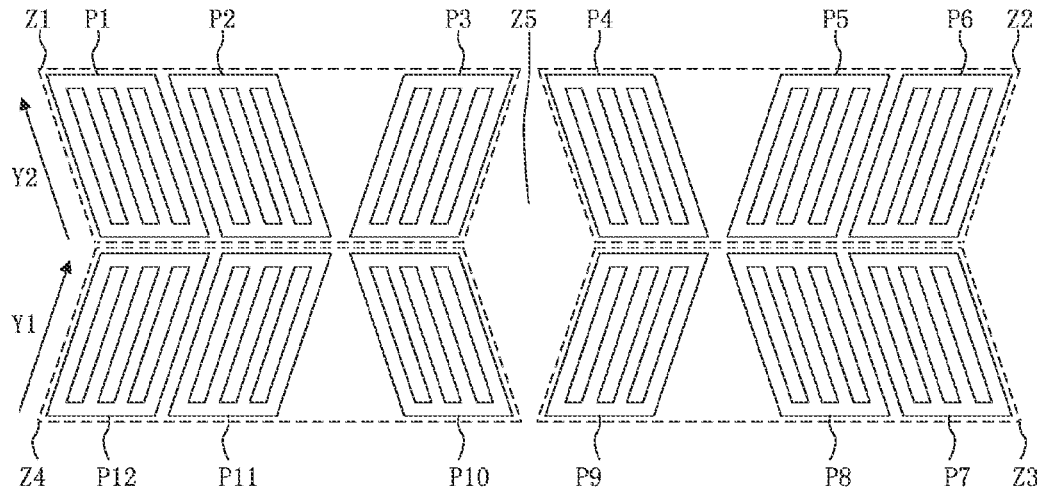
FIG. 3B is a schematic diagram of the structure of another pixel unit according to some embodiments of the disclosure.

In another example, referring to FIG. 3B, the strip electrodes of both the third sub-pixel electrode P3 and the ninth sub-pixel electrode P9 are parallel to the first direction Y1, and the strip electrodes of both the fourth sub-pixel electrode P4 and the tenth sub-pixel electrode P10 are parallel to the second direction Y2; further, the strip electrodes of the first sub-pixel electrode P1, the second sub-pixel electrode P2, the seventh sub-pixel electrode P7 and the eighth sub-pixel electrode P8 are parallel to the second direction Y2, the strip electrodes of the fifth sub-pixel electrode P5, the sixth sub-pixel electrode P6, the eleventh sub-pixel electrode P11 and the twelfth sub-pixel electrode P12 are parallel to the first direction Y1, and the first are Z5 is formed accordingly.

Figure 3C:
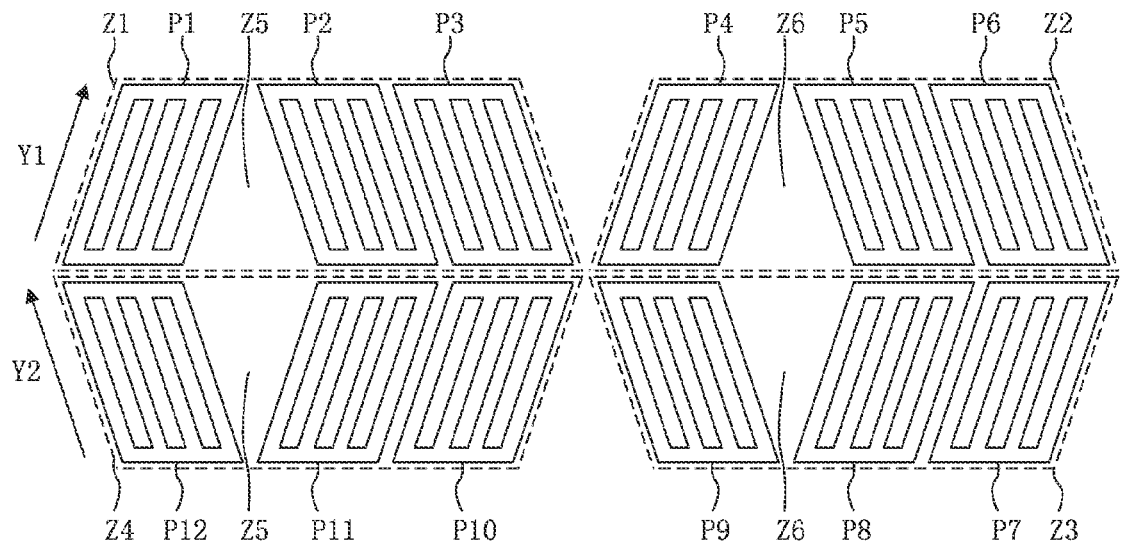
FIG. 3C is a schematic diagram of the structure of a further pixel unit according to some embodiments of the disclosure.
Figure 3D:
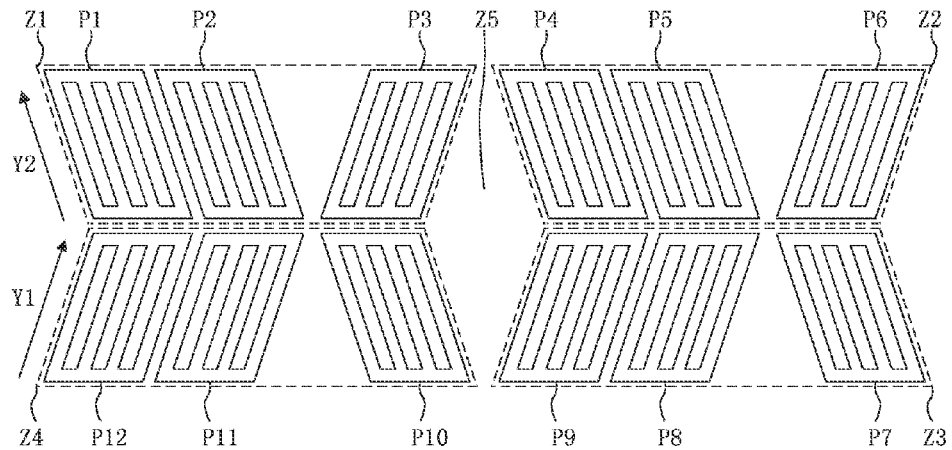
FIG. 3D is a schematic diagram of the structure of a yet further pixel unit according to some embodiments of the disclosure.

Additionally, it is also possible that the strip electrode of one of the sub-pixel electrodes from the first sub-pixel area Z1 is parallel to the first direction Y1, but the strip electrodes of two of the sub-pixel electrodes from the third sub-pixel area Z3 are parallel to the first direction Y1, and the strip electrodes of two of the sub-pixel electrodes from the second sub-pixel area Z2 are parallel to the second direction Y2, and the strip electrode of one of the sub-pixel electrode from the fourth sub-pixel area Z4 is parallel to the second direction Y2. For example, referring to FIG. 3C, the strip electrodes of the first sub-pixel electrode P1, the seventh sub-pixel electrode P7 and the eighth sub-pixel electrode P8 are parallel to the first direction Y1, the strip electrodes of the fifth sub-pixel electrode P5, the sixth sub-pixel electrode P6 and the twelfth sub-pixel electrode P12 are parallel to the second direction Y2; further, the strip electrodes of the second sub-pixel electrode P2, the third sub-pixel electrode P3 and the ninth sub-pixel electrode P9 are parallel to the second direction Y2, and the strip electrodes of the fourth sub-pixel electrode P4, the tenth sub-pixel electrode P10 and the eleventh sub-pixel electrode P11 are parallel to the first direction Y1, and the two first areas Z5 and Z6 are formed accordingly; or alternatively, referring to FIG. 3D, the strip electrodes of the third sub-pixel electrode P3, the eighth sub-pixel electrode P8 and the ninth sub-pixel electrode P9 are parallel to the first direction Y1, and the strip electrodes of the fourth sub-pixel electrode P4, the fifth sub-pixel electrode P5 and the tenth sub-pixel electrode P10 are parallel to the second direction Y2; further, the strip electrodes of the first sub-pixel electrode P1, the second sub-pixel electrode P2 and the seventh sub-pixel electrode P7 are parallel to the second direction Y2, the strip electrodes of the sixth sub-pixel electrode P6, the eleventh sub-pixel electrode P11 and the twelfth sub-pixel electrode P12 are parallel to the first direction Y1, and the first area Z5 is formed accordingly.

Figure 4A:
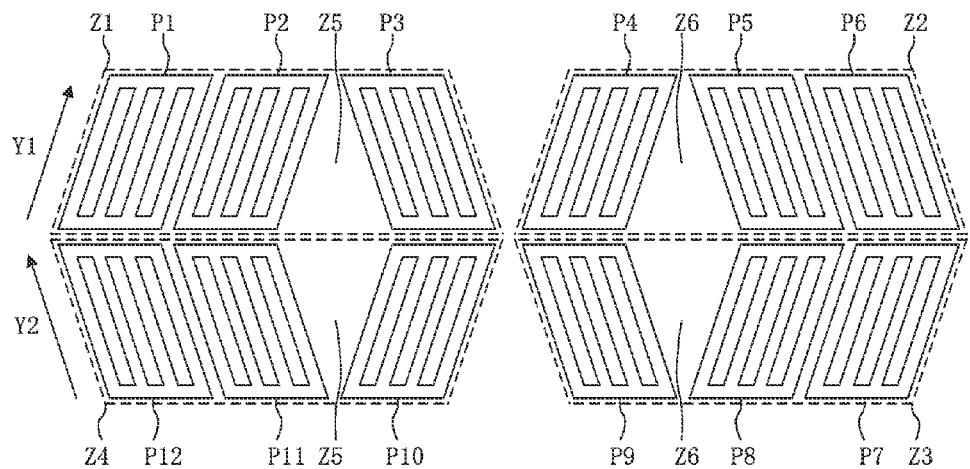
FIG. 4A is a schematic diagram of the structure of a pixel unit according to some embodiments of the disclosure.

FIG. 4A is a schematic diagram showing the structure of a pixel unit according to some embodiments of the disclosure. Referring to FIG. 4A, a pixel unit on the array substrate is such that each of the four sub-pixel areas includes three sub-pixel electrodes arranged in a 1×3 sub-pixel electrode matrix; the strip electrodes of two of the sub-pixel electrodes from each of the first sub-pixel area Z1 and the third sub-pixel area Z3 are parallel to the first direction; and the strip electrodes of two of the sub-pixel electrodes from each of the second sub-pixel area Z2 and the fourth sub-pixel area Z4 are parallel to the second direction Y2; and the pixel unit includes two first areas (Z5 and Z6).

Referring to FIG. 4A, the strip electrodes of the first sub-pixel electrode P1, the second sub-pixel electrode P2, the seventh sub-pixel electrode P7 and the eighth sub-pixel electrode P8 are parallel to the first direction Y1, and the strip electrodes of the fifth sub-pixel electrode P5, the sixth sub-pixel electrode P6, the eleventh sub-pixel electrode P11 and the twelfth sub-pixel electrode P12 are parallel to the second direction Y2; further, the strip electrodes of both the third sub-pixel electrode P3 and the ninth sub-pixel electrode P9 are parallel to the second direction Y2, and the strip electrodes of both the fourth sub-pixel electrode P4 and the tenth sub-pixel electrode P10 are parallel to the first direction Y1.

Figure 4B:
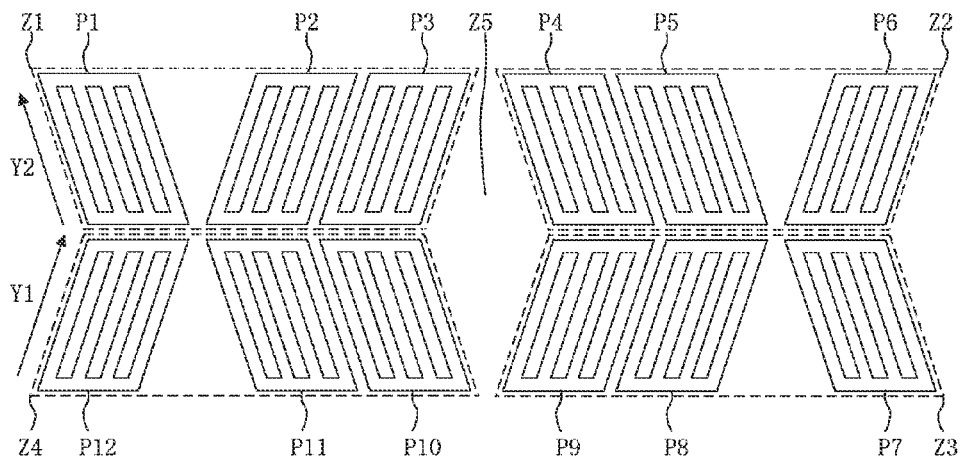
FIG. 4B is a schematic diagram of the structure of another pixel unit according to some embodiments of the disclosure.

In another example, referring to FIG. 4B, the strip electrodes of the second sub-pixel electrode P2, the third sub-pixel electrode P3, the eighth sub-pixel electrode P8 and the ninth sub-pixel electrode P9 are parallel to the first direction Y1, and the strip electrode of the fourth sub-pixel electrode P4, the fifth sub-pixel electrode P5, the tenth sub-pixel electrode P10 and the eleventh sub-pixel electrode P11 are parallel to the second direction Y2; further, the strip electrodes of both the first sub-pixel electrode P1 and the seventh sub-pixel electrode P7 are parallel to the second direction Y2, the strip electrodes of both the sixth sub-pixel electrode P6 and the twelfth sub-pixel electrode P12 are parallel to the first direction Y1, and the first area Z5 is formed accordingly.

Figure 4C:
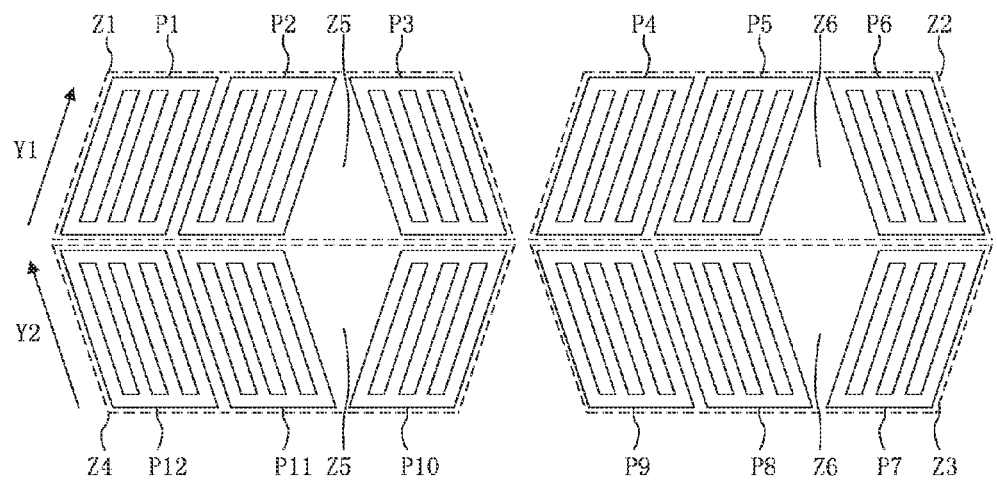
FIG. 4C is a schematic diagram of the structure of a further pixel unit according to some embodiments of the disclosure.
Figure 4D:
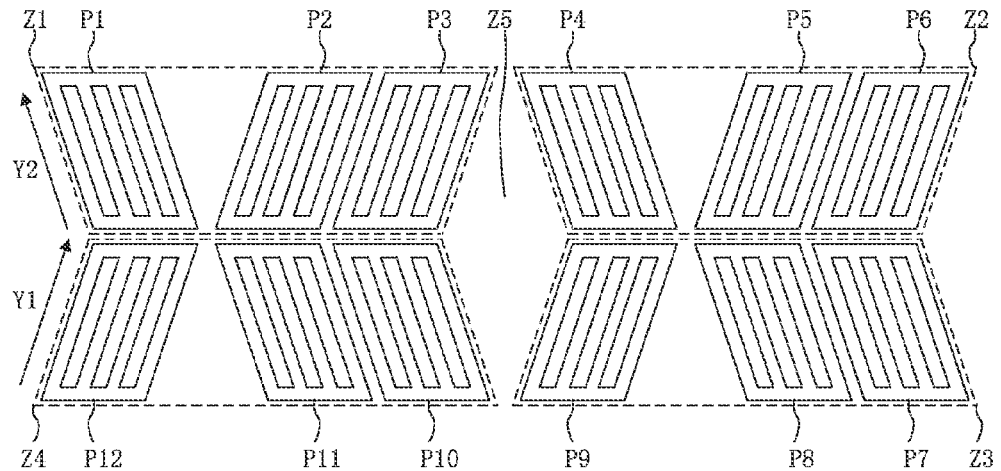
FIG. 4D is a schematic diagram of the structure of a yet further pixel unit according to some embodiments of the disclosure.

Additionally, it is also possible that the strip electrodes of two of the sub-pixel electrodes from the first sub-pixel area Z1 are parallel to the first direction Y1, and the strip electrode of one of the sub-pixel electrodes from the third sub-pixel area Z3 is parallel to the first direction Y1, and the strip electrode of one of the sub-pixel electrodes from the second sub-pixel area Z2 is parallel to the second direction Y2, and the strip electrodes of two of the sub-pixel electrodes from the fourth sub-pixel area Z4 are parallel to the second direction Y2. For example, referring to FIG. 4C, the strip electrodes of the first sub-pixel electrode P1, the second sub-pixel electrode P2 and the seventh sub-pixel electrode P7 are parallel to the first direction Y1, and the strip electrodes of the sixth sub-pixel electrode P6, the eleventh sub-pixel electrode P11 and the twelfth sub-pixel electrode P12 are parallel to the second direction Y2; further, the strip electrodes of the third sub-pixel electrode P3, the eighth sub-pixel electrode P8 and the ninth sub-pixel electrode P9 are parallel to the second direction Y2, the strip electrodes of the fourth sub-pixel electrode P4, the fifth sub-pixel electrode P5 and the tenth sub-pixel electrode P10 are parallel to the first direction Y1, and the two first areas Z5 and Z6 are formed accordingly; or alternatively, referring to FIG. 4D, the strip electrodes of the second sub-pixel electrode P2, the third sub-pixel electrode P3 and the ninth sub-pixel electrode P9 are parallel to the first direction Y1, and the strip electrodes of the fourth sub-pixel electrode P4, the tenth sub-pixel electrode P10 and the eleventh sub-pixel electrode P11 are parallel to the second direction Y2; further, the strip electrodes of the first sub-pixel electrode P1, the seventh sub-pixel electrode P7 and the eighth sub-pixel electrode P8 are parallel to the second direction Y2, the strip electrodes of the fifth sub-pixel electrode P5, the sixth sub-pixel electrode P6 and the twelfth sub-pixel electrode P12 are parallel to the first direction Y1, and the first area Z5 is formed accordingly.

In the above embodiments, the three sub-pixel electrodes from each of the four sub-pixel areas are embodied as a red sub-pixel electrode, a green sub-pixel electrode and a blue sub-pixel electrode, respectively. It is noted that the three sub-pixel electrodes in the same sub-pixel area can be arranged in any order, and hence may be embodied as a red sub-pixel electrode, a green sub-pixel electrode and a blue sub-pixel electrode in sequence, or may be embodied as a green sub-pixel electrode, a red sub-pixel electrode and a blue sub-pixel electrode in sequence, for example, which is not limited herein.

Also, in some embodiments, the sub-pixel electrodes in the same column from the first sub-pixel area and the fourth sub-pixel area are of the same color, and the sub-pixel electrodes in the same column from the second sub-pixel area and the third sub-pixel area are of the same color.

Also, in some embodiments, within the four sub-pixel areas, the numbers of the red sub-pixel electrodes, of the green sub-pixel electrodes and of the blue sub-pixel electrodes parallel to the first direction are equal to the numbers of the red sub-pixel electrodes, of the green sub-pixel electrodes and of the blue sub-pixel electrodes parallel to the second direction, respectively.

Next, embodiments are described to illustrate the configuration of the sub-pixel switches, the data lines and the gate lines in the pixel unit.

Figure 5:
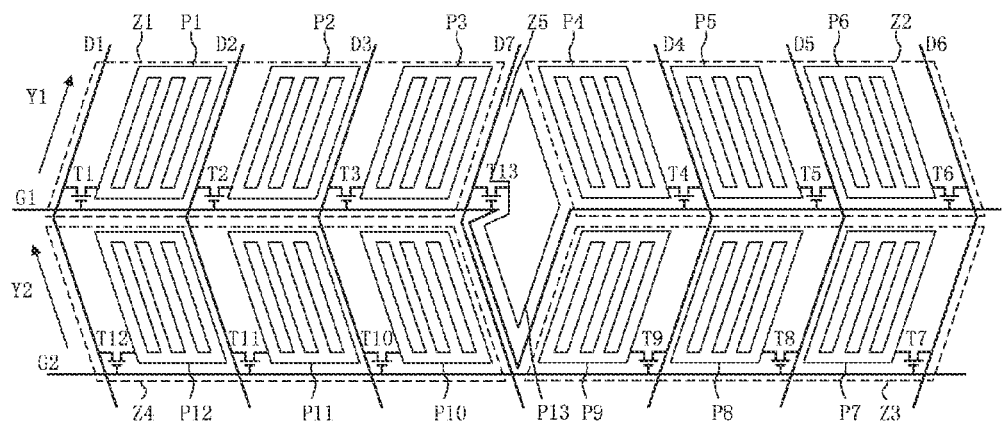
FIG. 5 is a schematic diagram of the structure of a pixel unit according to some embodiments of the disclosure.

FIG. 5 is a schematic diagram showing the structure of a pixel unit according to some embodiments of the disclosure.

It is noted that FIG. 5 shows the configuration of the data lines, the gate lines and the sub-pixel switches in the pixel unit as shown in FIG. 1B. Referring to FIG. 5, the pixel unit further includes: thirteen sub-pixel switches (T1 to T13) configured for controlling the thirteen sub-pixel electrodes (P1 to P13); two gate lines (G1 and G2) and seven data lines (D1 to D7) intersecting with the two gate lines, with the gate lines and the data lines being electrically connected with the sub-pixel switches, respectively; each of the sub-pixel electrodes in the pixel unit includes a first side and a second side (not shown), where the first side intersects with the second side, and the first side is parallel to the first direction Y1 or the second direction Y2; the data lines are parallel to the first side, and the gates lines include a flexuous line.

Further, referring to FIG. 5, the portion of the gate line in the four sub-pixel areas (Z1 to Z4) is parallel to the second side, and the portion of the gate line in the first area Z5 includes a flexuous segment.

It is noted that in FIG. 5, the sub-pixel electrode has the same shape with the strip electrode of the sub-pixel electrode, and accordingly, the first side of the sub-pixel electrode is parallel to the long side of the strip electrode, and the second side of the sub-pixel electrode is parallel to the short side of the strip electrode, and thus it can be seen from FIG. 5 that the data lines are parallel to the long sides of the strip electrodes, and the portions of the gate lines in the four sub-pixel areas (Z1 to Z4) are parallel to the short sides of the strip electrodes.

In FIG. 5, a gate electrode of the first sub-pixel switch T1 is electrically connected with the first gate line G1, a source electrode of the first sub-pixel switch T1 is electrically connected with the first data line D1, and a drain electrode of the first sub-pixel switch T1 is electrically connected with the first sub-pixel electrode P1; a gate electrode of the second sub-pixel switch T2 is electrically connected with the first gate line G1, a source electrode of the second sub-pixel switch T2 is electrically connected with the second data line D2, and a drain electrode of the second sub-pixel switch T2 is electrically connected with the second sub-pixel electrode P2; a gate electrode of the third sub-pixel switch T3 is electrically connected with the first gate line G1, a source electrode of the third sub-pixel switch T3 is electrically connected with the third data line D3, and a drain electrode of the third sub-pixel switch T3 is electrically connected with the third sub-pixel electrode P3; a gate electrode of the fourth sub-pixel switch T4 is electrically connected with the first gate line G1, a source electrode of the fourth sub-pixel switch T4 is electrically connected with the fourth data line D4, and a drain electrode of the fourth sub-pixel switch T4 is electrically connected with the fourth sub-pixel electrode P4; a gate electrode of the fifth sub-pixel switch T5 is electrically connected with the first gate line G1, a source electrode of the fifth sub-pixel switch T5 is electrically connected with the fifth data line D5, and a drain electrode of the fifth sub-pixel switch T5 is electrically connected with the fifth sub-pixel electrode P5; a gate electrode of the sixth sub-pixel switch T6 is electrically connected with the first gate line G1, a source electrode of the sixth sub-pixel switch T6 is electrically connected with the sixth data line D6, and a drain electrode of the sixth sub-pixel switch T6 is electrically connected with the sixth sub-pixel electrode P6; a gate electrode of the seventh sub-pixel switch T7 is electrically connected with the second gate line G2, a source electrode of the seventh sub-pixel switch T7 is electrically connected with the sixth data line D6, and a drain electrode of the seventh sub-pixel switch T7 is electrically connected with the seventh sub-pixel electrode P7; a gate electrode of the eighth sub-pixel switch T8 is electrically connected with the second gate line G2, a source electrode of the eighth sub-pixel switch T8 is electrically connected with the fifth data line D5, and a drain electrode of the eighth sub-pixel switch T8 is electrically connected with the eighth sub-pixel electrode P8; a gate electrode of the ninth sub-pixel switch T9 is electrically connected with the second gate line G2, a source electrode of the ninth sub-pixel switch T9 is electrically connected with the fourth data line D4, and a drain electrode of the ninth sub-pixel switch T9 is electrically connected with the ninth sub-pixel electrode P9; a gate electrode of the tenth sub-pixel switch T10 is electrically connected with the second gate line G2, a source electrode of the tenth sub-pixel switch T10 is electrically connected with the third data line D3, and a drain electrode of the tenth sub-pixel switch T10 is electrically connected with the tenth sub-pixel electrode P10; a gate electrode of the eleventh sub-pixel switch T11 is electrically connected with the second gate line G2, a source electrode of the eleventh sub-pixel switch T11 is electrically connected with the second data line D2, and a drain electrode of the eleventh sub-pixel switch T11 is electrically connected with the eleventh sub-pixel electrode P11; a gate electrode of the twelfth sub-pixel switch T12 is electrically connected with the second gate line G2, a source electrode of the twelfth sub-pixel switch T12 is electrically connected with the first data line D1, and a drain electrode of the twelfth sub-pixel switch T12 is electrically connected with the twelfth sub-pixel electrode P12; a gate electrode of the thirteenth sub-pixel switch T13 is electrically connected with the first gate line G1, a source electrode of the thirteenth sub-pixel switch T13 is electrically connected with the seventh data line D7, and a drain electrode of the thirteenth sub-pixel switch T13 is electrically connected with the thirteenth sub-pixel electrode P13.

A margin formed between each data line and the corresponding sub-pixel electrode is reduced by employing the above arrangement of the data lines, in comparison with the arrangement of the data lines in the vertical direction; additionally, the first gate line G1 (the portion of which in the first area Z5 includes a flexuous segment) is used for driving the thirteenth sub-pixel switch T13 provided in the first area Z5, and also driving the sub-pixel switches (T1 to T6) from the first sub-pixel area Z1 and the second sub-pixel area Z2, so that not only the number of wirings is reduced since a separate gate line may not need to be additionally provided for the thirteen sub-pixel switch T13, but also the thirteenth sub-pixel electrode P13 can be driven together with the sub-pixel electrodes from each of the first sub-pixel area Z1 and the second sub-pixel area Z2, thereby ensuring display effect of the array substrate.

Figure 6A:
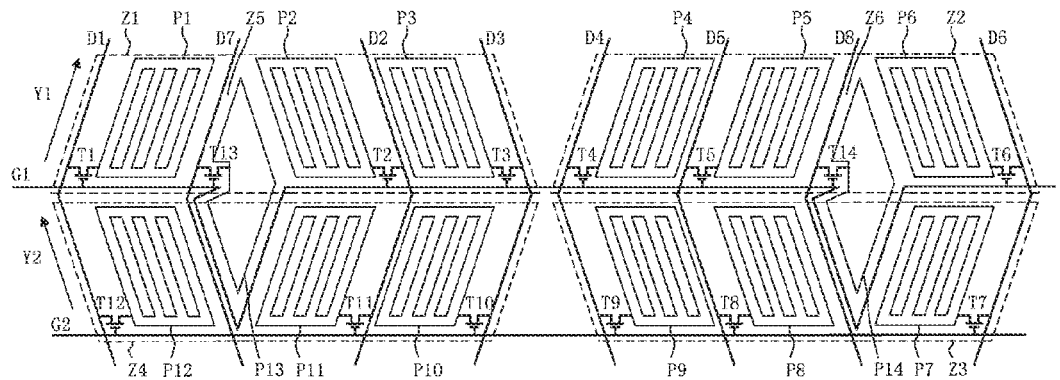
FIG. 6A is a schematic diagram of the structure of a pixel unit according to some embodiments of the disclosure.

FIG. 6A is a schematic diagram showing the structure of a pixel unit according to some embodiments of the disclosure. It is noted that FIG. 6A shows the configuration of the data lines, the gate lines and the sub-pixel switches in the pixel unit as shown in FIG. 3A in the embodiment described in FIG. 3A. Referring to FIG. 6A, the pixel unit further includes: fourteen sub-pixel switches (T1 to T14) configured for controlling the fourteen sub-pixel electrodes (P1 to P14); two gate lines (G1 and G2) and eight data lines (D1 to D8), with the gate lines intersecting with the data lines and being electrically connected with the sub-pixel switches, respectively; each of the sub-pixel electrodes in the pixel unit includes a first side and a second side (not shown), where the first side intersects with the second side, and the first side is parallel to the first direction Y1 or the second direction Y2; the data lines are parallel to the first side, and the gates lines include a flexuous line.

Further, referring to FIG. 6A, the portion of the gate line in the four sub-pixel areas (Z1 to Z4) is parallel to the second side, and the portion of the gate line in the first area (Z5 and Z6) includes a flexuous segment.

It is noted that the configuration of the data lines, the gate lines and the sub-pixel switches configured for controlling the first sub-pixel electrode P1 to the twelfth sub-pixel electrode P12 from the four sub-pixel areas (Z1 to Z4) shown in FIG. 6A is the same as that shown and described in FIG. 5, such that the description is not repeated here. However, the pixel unit shown in FIG. 6A is different from the pixel unit shown and described in FIG. 5 in that the pixel unit shown in FIG. 6A includes two first areas (Z5 and Z6), where the thirteen sub-pixel electrode P13 and the thirteen sub-pixel switch T13 for controlling the thirteenth sub-pixel electrode P13 are provided in the first area Z5 located at the left side of the pixel unit (referring to FIG. 6A), and the fourteen sub-pixel electrode P14 and the fourteen sub-pixel switch T14 for controlling the fourteen sub-pixel electrode P14 are provided in the first area Z6 located at the right side of the pixel unit (referring to FIG. 6A), and where, a gate electrode of the thirteen sub-pixel switch T13 is electrically connected with the first gate line G1, a source electrode of the thirteen sub-pixel switch T13 is electrically connected with the seventh data line D7, and a drain electrode of the thirteen sub-pixel switch T13 is electrically connected with the thirteenth sub-pixel electrode P13; a gate electrode of the fourteenth sub-pixel switch T14 is electrically connected with the first gate line G1, a source electrode of the fourteenth sub-pixel switch T14 is electrically connected with the eighth data line D8, and a drain electrode of the fourteenth sub-pixel switch T14 is electrically connected with the fourteenth sub-pixel electrode P14.

Figure 6B:
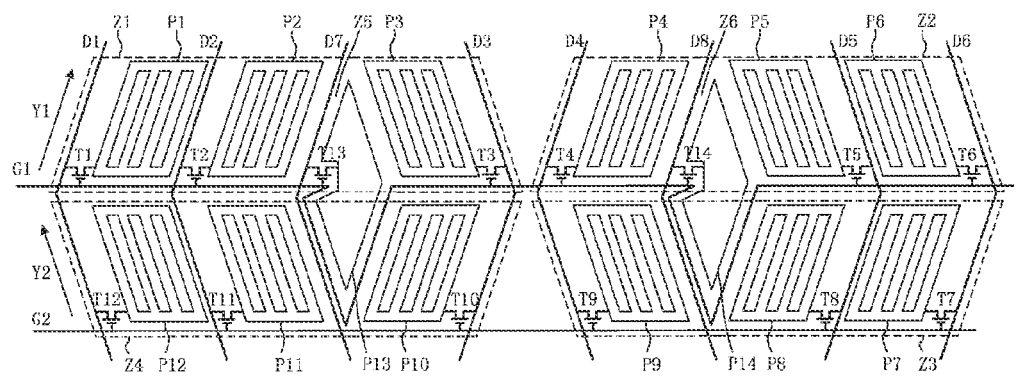
FIG. 6B is a schematic diagram of the structure of another pixel unit according to some embodiments of the disclosure.

The above description illustrates the configuration of the data lines, the gates lines and the sub-pixel switches in the pixel unit as shown in FIG. 3A. The configuration of the data lines, the gates lines and the sub-pixel switches in the pixel unit shown in FIG. 4A is shown in FIG. 6B. The configuration of the data lines, the gates lines and the sub-pixel switches in the pixel unit as shown in FIG. 6A is the same as the configuration as shown in FIG. 6B, and thus the description with respect to FIG. 6B is the same as the description with respect to FIG. 6A, and will not be repeated here.

It is noted that each of the sub-pixel switches in the above embodiment described in FIG. 5 and the embodiment described in FIG. 6A can be embodied by a Thin Film Transistor (TFT).

Figure 2A:
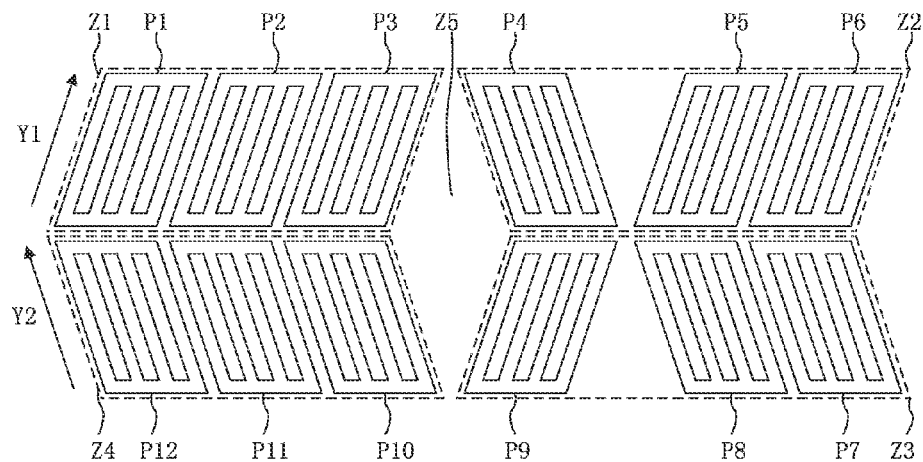
FIG. 2A is a schematic diagram of the structure of a pixel unit according to some embodiments of the disclosure.
Figure 2B:
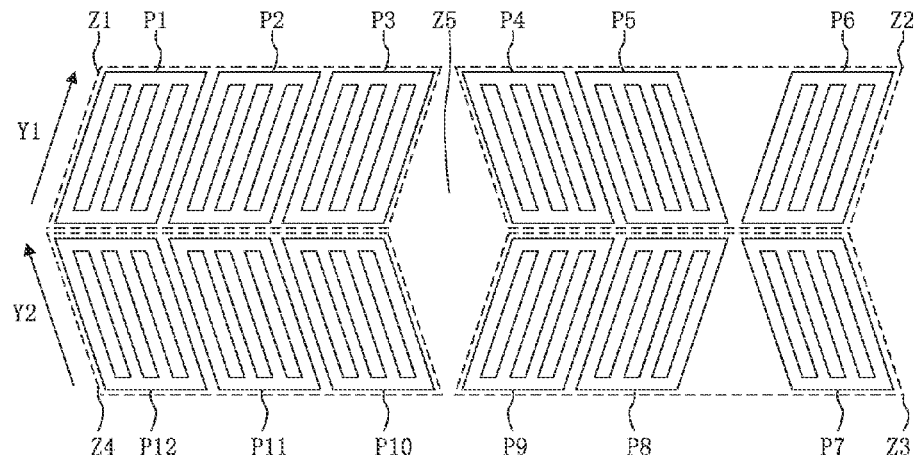
FIG. 2B is a schematic diagram of the structure of another pixel unit according to some embodiments of the disclosure.
Figure 2C:
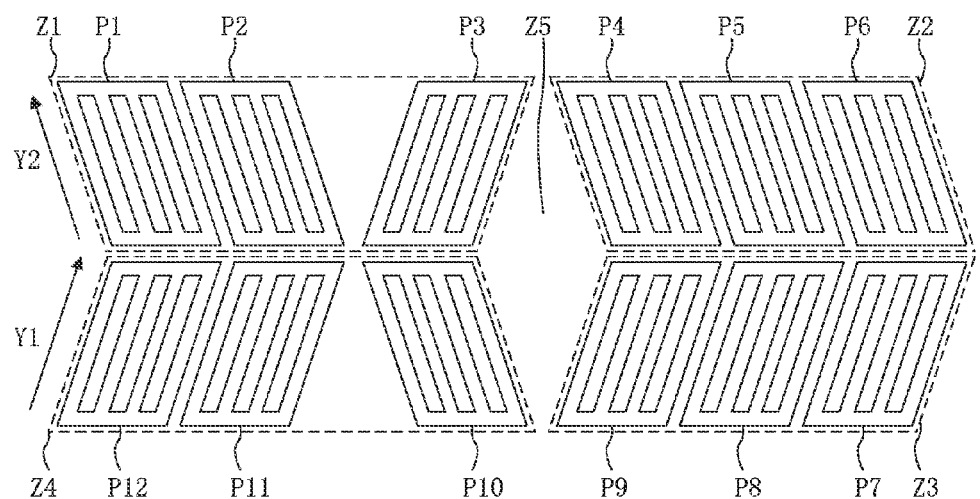
FIG. 2C is a schematic diagram of the structure of a further pixel unit according to some embodiments of the disclosure.
Figure 2D:
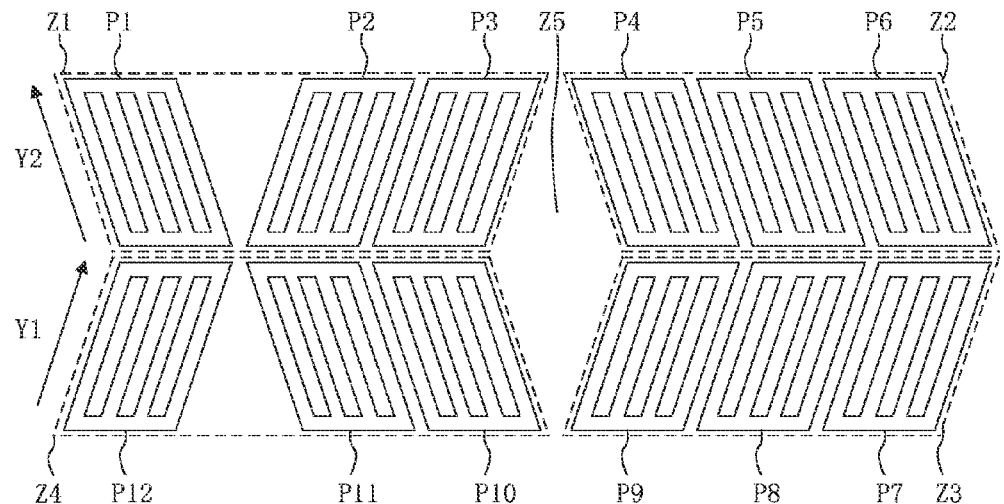
FIG. 2D is a schematic diagram of the structure of a yet further pixel unit according to some embodiments of the disclosure.

It is further noted that configuration of the data lines, the gate lines, the sub-pixel switches and the common electrode lines in the pixel units in the embodiments described in FIG. 2A, FIG. 3A and FIG. 4A can be referred to FIG. 5 and FIGS. 6A and 6B and the related descriptions thereof, and will not be repeated here.

As above, some embodiments with respect to the first area defined by the sub-pixel electrodes including the strip electrodes parallel to the first direction Y1 and the sub-pixel electrodes including the strip electrodes parallel to the second direction Y2 and the configuration of the first area are described. Next, examples embodying the above embodiments are described according to one technique.

Figure 7A:
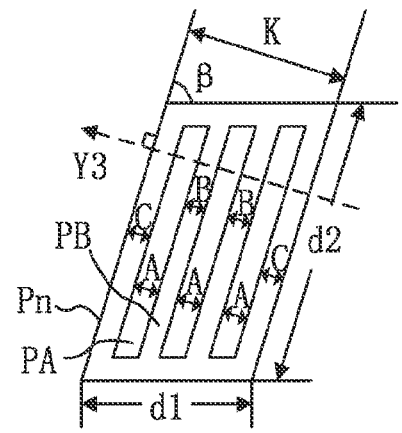
FIG. 7A is a schematic diagram of the structure of a sub-pixel electrode according to some embodiments of the disclosure.

In the process of designing the sub-pixel electrodes, both a size of a slit in the sub-pixel electrode and a width of the strip electrode between the slits may be limited by the technique. Under a certain technique, if A represents the minimum width of the slit that can be manufactured, B represents the minimum width of the strip electrode, and C represents a necessary distance from the slit at the edge of the sub-pixel electrode to the edge of the sub-pixel electrode, then the width K of the sub-pixel electrode may be represented as $K=2C+n\times A+(n-1)\times B$, where, n represents the number of the slits in the sub-pixel electrode. It is noted that the minimum width A of the slit, the minimum width B of the strip electrode, the necessary distance C and the width K of the sub-pixel electrode each indicate the size along a direction perpendicular to the long side of the sub-pixel electrode. FIG. 7A is a schematic diagram showing the structure of a sub-pixel electrode according to the embodiments described in FIG. 6A of the disclosure. Referring to FIG. 7A, a sub-pixel electrode Pn includes three slits PA having the minimum width A and two strip electrodes PB located between the slits PA and having the minimum width B, and a necessary distance from the slit PA at the edge of the sub-pixel electrode Pn to the edge of the sub-pixel electrode Pn is equal to C, and accordingly, the width K of the sub-pixel electrode Pn may be obtained as K=2C+3A+2B, where, A, B, C and K each indicate the size along the direction Y3 (i.e., the direction perpendicular to the long side of the sub-pixel electrode Pn), and K and d1 satisfies a relationship of K=d1*sin β.

Figure 7B:
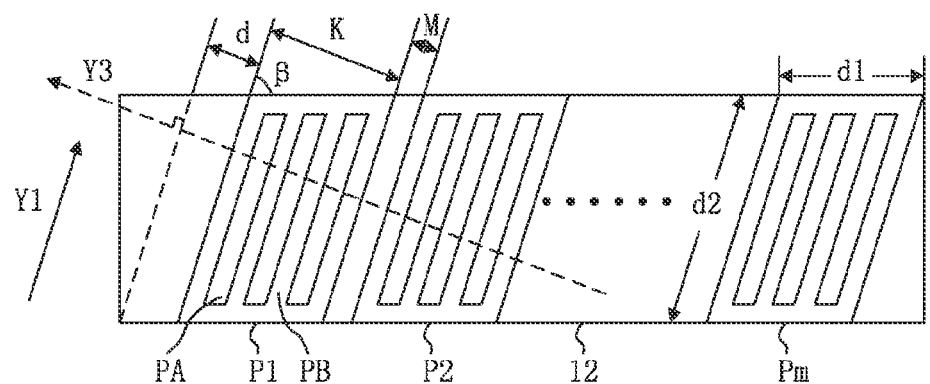
FIG. 7B is a schematic diagram of the structure of an array substrate according to some embodiments of the disclosure.

FIG. 7B is a schematic diagram showing the structure of an array substrate according to some embodiments of the disclosure. Referring to FIG. 7B, in a row of sub-pixel electrodes provided on an array substrate 12, a strip electrode PB of each of the sub-pixel electrodes P1 to Pm is parallel to the first direction Y1, where m is an integer larger than 1; M represents a distance between two adjacent sub-pixel electrodes, d represents a width of a margin for the row of sub-pixel electrodes, and M and d each indicate the size along the direction Y3, where d<m*(A+B) and d<(M+K) (i.e. d<M+2C+2A+B), which indicates that such margin is inadequate to accommodate a sub-pixel electrode (which is determined by the condition d<M+K) or to add a new slit in each of the sub-pixel electrodes (which is determined by the condition d<m*(A+B)). To overcome this case, the slit of the each of the sub-pixel electrodes is usually widened in the related art, so that the sub-pixel electrodes with the widened slits can just fully occupy the row on the array substrate, thereby eliminating the margin. Although the issue of the margin may be solved in this way, the widened slit of each of the sub-pixel electrodes will cause a serious black domain phenomenon in displaying.

In some embodiments of the disclosure, because of the presence of the first areas, a space occupied by one row of sub-pixel electrodes is larger than a space occupied by one row of sub-pixel electrodes shown in FIG. 7B where the two rows of sub-pixel electrodes have the same number of sub-pixel electrodes, so that the margin in FIG. 7B is eliminated. It is noted that if the size of the array substrate cannot accommodate one row of the sub-pixel electrodes in the above embodiments of the disclosure, each of the sub-pixel electrodes may be compressed properly. For example, one or more of the minimum width A of the slit in the sub-pixel electrode, the minimum width B of the strip electrode and the necessary distance C from the slit at the edge of the sub-pixel electrode to the edge of the sub-pixel electrode may be reduced properly through compression, so that the array substrate can just accommodate the row of sub-pixel electrodes.

Figure 8A:
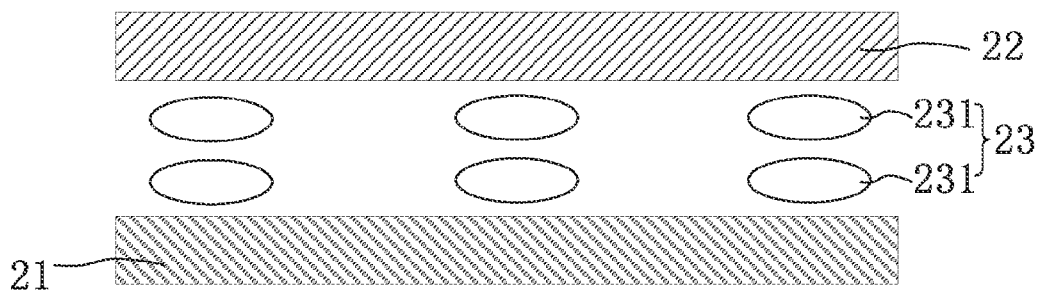
FIG. 8A is a schematic diagram of the structure of a display panel according to some embodiments of the disclosure.

FIG. 8A is a schematic diagram showing the structure of a display panel according to some embodiments of the disclosure. Referring to FIG. 8A, the display panel includes: a first substrate 21, a second substrate 22 and a liquid crystal layer 23 located between the first substrate 21 and the second substrate 22, where, the liquid crystal layer 23 includes liquid crystal molecules 231. The above second substrate 22 may be a color filter substrate, and the first substrate 21 may be the array substrate according to the above various embodiments.

Figure 8B:
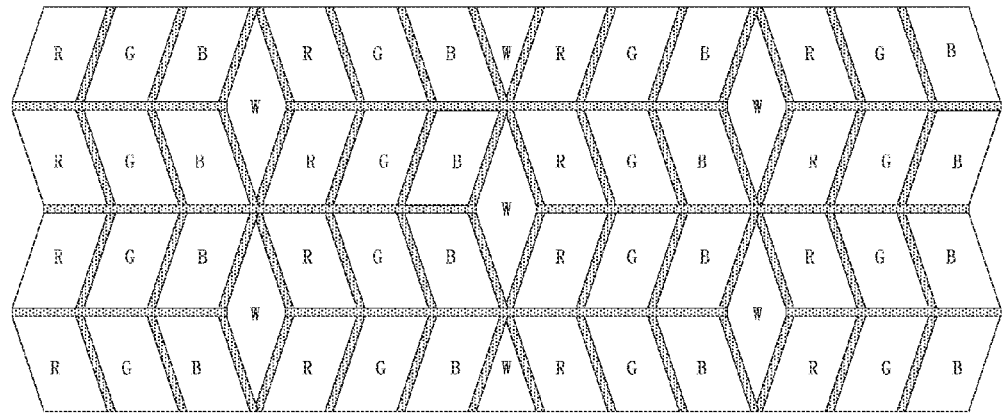
FIG. 8B is a schematic diagram of the structure of a color filter substrate according to some embodiments of the disclosure.
Figure 8C:
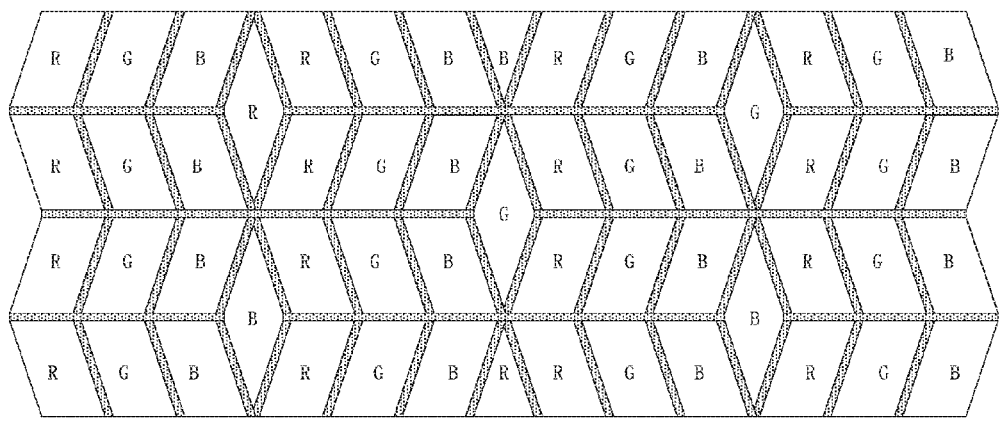
FIG. 8C is a schematic diagram of the structure of another color filter substrate according to some embodiments of the disclosure.

It is noted that the color filter substrate is disposed opposite to the array substrate. For example, on the array substrate, when the sub-pixel electrodes in the pixel unit are configured as shown in FIG. 1B, and when the twelve sub-pixel electrodes P1 to P12 are embodied as a red sub-pixel electrode, a green sub-pixel electrode, a blue sub-pixel electrode, a red sub-pixel electrode, a green sub-pixel electrode, a blue sub-pixel electrode, a blue sub-pixel electrode, a green sub-pixel electrode, a red sub-pixel electrode, a blue sub-pixel electrode, a green sub-pixel electrode, and a red sub-pixel electrode in sequence, a color filter layer on the color filter substrate is configured as shown in FIG. 8B or 8C. In FIG. 8B, a white color filter is provided on the color filter layer of the color filter substrate which corresponds to the thirteenth sub-pixel electrode P13 on the array substrate. In FIG. 8C, a red color filter, a green color filter and a blue color filter are provided on the color filter layer of the color filter substrate which corresponds to the thirteenth sub-pixel electrode P13 on the array substrate. In FIGS. 8B and 8C, R represents a red color filter, G represents a green color filter, B represents a blue color filter and W represents a white color filter, and a darken area between the color filters represents a portion shielded by the black matrix in the color filter substrate.

In some embodiments the above display panel may have a touch sensing function. The touch function may be an electromagnetic touch sensing function, a capacitive touch sensing function or an electromagnetism and capacitance integrated touch sensing function.

Due to the presence of the array substrate in the display panel and the arrangement pattern of the strip electrodes in each row of the sub-pixel electrodes according to the above embodiments, the transverse striation can be effectively avoided in the case that the rubbing orientation direction is deviated in rubbing or the polarizer is deviated in adhering, and thus the display panel has the above beneficial effect likewise.

Figure 9:
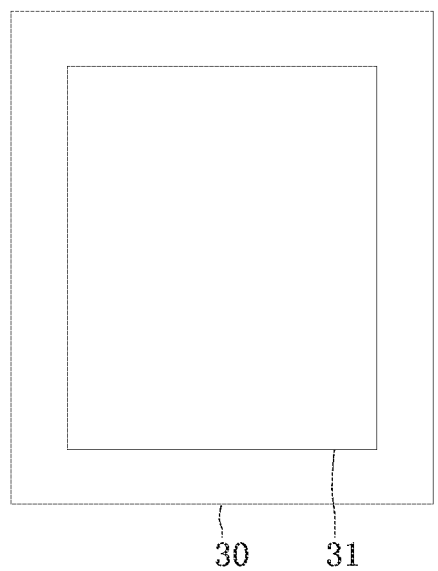
FIG. 9 is a schematic diagram of the structure of a display device according to some embodiments of the disclosure.

FIG. 9 is a schematic diagram showing the structure of a display device according to some embodiments of the disclosure. Referring to FIG. 9, the display device 30 includes a display panel 31, and may further include a drive circuit and other devices for supporting normal operation of the display device 30. The display panel 31 is the display panel according to the above embodiments described in FIG. 8A. The above display device 30 may be one of a cellphone, a desktop computer, a notebook, a tablet computer and an electric paper.

Since the display panel, in which the transverse striation can be effectively avoided in the case that the rubbing orientation direction is deviated in rubbing or the polarizer is deviated in adhering, is provided in the display device, the display device has the same beneficial effect.

Various modifications and additions can be made to the exemplary embodiments discussed without departing from the scope of the present disclosure. For example, while the embodiments described above refer to particular features, the scope of the disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:
1. An array substrate, comprising:
a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence;
wherein each of the sub-pixel areas comprises three sub-pixel electrodes;

each of the sub-pixel electrodes comprises a strip electrode;

the strip electrode of at least one of the sub-pixel electrodes from each of the first sub-pixel area and the third sub-pixel area is parallel to a first direction;

the strip electrode of at least one of the sub-pixel electrodes from each of the second sub-pixel area and the fourth sub-pixel area is parallel to a second direction;

the first direction intersects with the second direction, to form an angle larger than 0° and smaller than or equal to 90° between the first direction and the second direction;

wherein, a first area is defined by the sub-pixel electrodes comprising the strip electrodes parallel to the first direction and the sub-pixel electrodes comprising the strip electrodes parallel to the second direction, and is provided with a sub-pixel electrode.

2. The array substrate of claim 1, wherein all of the sub-pixel electrodes from the first sub-pixel area, the second sub-pixel area, the third sub-pixel area and the fourth sub-pixel area have the same length;

at least one of the sub-pixel electrodes from each of the first sub-pixel area and the third sub-pixel area is parallel to the first direction;

at least one of the sub-pixel electrodes from each of the second sub-pixel area and the fourth sub-pixel area is parallel to the second direction; and the pixel unit comprises at least one said first area, and the first area has a parallelogram shape.

3. The array substrate of claim 2, wherein, each of the first sub-pixel area, the second sub-pixel area, the third sub-pixel area and the fourth sub-pixel area comprises three sub-pixel electrodes arranged in a 1×3 sub-pixel electrode matrix;

the strip electrode of all of the sub-pixel electrodes from each of the first sub-pixel area and the third sub-pixel area is parallel to the first direction;

the strip electrode of all of the sub-pixel electrodes from each of the second sub-pixel area and the fourth sub-pixel area is parallel to the second direction; and the pixel unit comprises one said first area.

4. The array substrate of claim 3, wherein, the pixel unit further comprises:

thirteen sub-pixel switches configured for controlling the thirteen sub-pixel electrodes; and two gate lines and seven data lines intersecting with the two gate lines, with the gate lines and data line being electrically connected with the sub-pixel switches, respectively;

each of the sub-pixel electrodes in the pixel unit has a first side and a second side, wherein, the first side intersects with the second side, and the first side is parallel to the first direction or the second direction;

the data lines are parallel to the first side, and the gate lines are flexuous.

5. The array substrate of claim 4, wherein, the portion of the gate lines in the four sub-pixel areas is parallel to the second side, and the portion of the gate lines in the first area include a flexuous segment.

6. The array substrate of claim 3, wherein, three sub-pixels in the four sub-pixel areas are embodied as a red sub-pixel electrode, a green sub-pixel electrode and a blue sub-pixel electrode, respectively.

7. The array substrate of claim 6, wherein, the sub-pixel electrodes in the same column from the first sub-pixel area and the fourth sub-pixel area are of the same color, and the sub-pixel electrodes in the same column from the second sub-pixel area and the third sub-pixel area are of the same color.

8. The array substrate of claim 7, wherein, in the four sub-pixel areas, the numbers of the red sub-pixel electrodes, of the green sub-pixel electrodes and of the blue sub-pixel electrodes parallel to the first direction are equal to the numbers of the red sub-pixel electrodes, of the green sub-pixel electrodes and of the blue sub-pixel electrodes parallel to the second direction respectively, respectively.

9. The array substrate of claim 2, wherein, each of the first sub-pixel area, the second sub-pixel area, the third sub-pixel area and the fourth sub-pixel area comprises three sub-pixel electrodes arranged in a 1×3 sub-pixel electrode matrix;

the strip electrode of one of the sub-pixel electrodes from each of the first sub-pixel area and the third sub-pixel area is parallel to the first direction;

the strip electrode of one of the sub-pixel electrodes from each of the second sub-pixel area and the fourth sub-pixel area is parallel to the second direction; and the pixel unit comprises two said first areas.

10. The array substrate of claim 9, wherein, the pixel unit further comprises:

fourteen sub-pixel switches configured for controlling fourteen sub-pixel electrodes; and two gate lines and eight data lines intersecting with the two gate lines, with the gate lines and the data lines and being electrically connected with the sub-pixel switches, respectively;

each of the sub-pixel electrodes in the pixel unit has a first side and a second side, the first side intersects with the second side, and the first side is parallel to the first direction or the second direction;

the data lines are parallel to the first side, and the gate lines are flexuous.

11. The array substrate of claim 10, wherein, the portion of the gate lines in the four sub-pixel areas is parallel to the second side, and the portion of the gate lines in the first area include a flexuous segment.

12. The array substrate of claim 9, wherein, three sub-pixels in the four sub-pixel areas are embodied as a red sub-pixel electrode, a green sub-pixel electrode and a blue sub-pixel electrode, respectively.

13. The array substrate of claim 12, wherein, the sub-pixel electrodes in the same column from the first sub-pixel area and the fourth sub-pixel area are of the same color, and the sub-pixel electrodes in the same column from the second sub-pixel area and the third sub-pixel area are of the same color.

14. The array substrate of claim 13, wherein, in the four sub-pixel areas, the numbers of the red sub-pixel electrodes, of the green sub-pixel electrodes and of the blue sub-pixel electrodes parallel to the first direction are equal to the numbers of the red sub-pixel electrodes, of the green sub-pixel electrodes and of the blue sub-pixel electrodes parallel to the second direction respectively, respectively.

15. The array substrate of claim 1, wherein, the sub-pixel electrode in the first area is any one of a red sub-pixel electrode, a green sub-pixel electrode, a blue sub-pixel electrode and a white sub-pixel electrode.

16. A display panel, comprising a first substrate, a second substrate, and a liquid crystal layer located between the first substrate and the second substrate, wherein, the first substrate comprising:

a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence;
wherein each of the sub-pixel areas comprises three sub-pixel electrodes;
each of the sub-pixel electrodes comprises a strip electrode;
the strip electrode of at least one of the sub-pixel electrodes from each of the first sub-pixel area and the third sub-pixel area is parallel to a first direction;
the strip electrode of at least one of the sub-pixel electrodes from each of the second sub-pixel area and the fourth sub-pixel area is parallel to a second direction;
the first direction intersects with the second direction, to form an angle larger than 0° and smaller than or equal to 90° between the first direction and the second direction;
wherein, a first area is defined by the sub-pixel electrodes comprising the strip electrodes parallel to the first direction and the sub-pixel electrodes comprising the strip electrodes parallel to the second direction, and is provided with a sub-pixel electrode.

17. A display device, comprising a display panel, wherein the display panel comprising a first substrate, a second substrate, and a liquid crystal layer located between the first substrate and the second substrate, wherein, the first substrate comprising:

a plurality of pixel units each comprising a 2×2 sub-pixel area matrix, with the 2×2 sub-pixel area matrix comprising a first sub-pixel area, a second sub-pixel area, a third sub-pixel area and a fourth sub-pixel area arranged in sequence; wherein
each of the sub-pixel areas comprises three sub-pixel electrodes;
each of the sub-pixel electrodes comprises a strip electrode;
the strip electrode of at least one of the sub-pixel electrodes from each of the first sub-pixel area and the third sub-pixel area is parallel to a first direction;
the strip electrode of at least one of the sub-pixel electrodes from each of the second sub-pixel area and the fourth sub-pixel area is parallel to a second direction;
the first direction intersects with the second direction, to form an angle larger than 0° and smaller than or equal to 90° between the first direction and the second direction;
wherein, a first area is defined by the sub-pixel electrodes comprising the strip electrodes parallel to the first direction and the sub-pixel electrodes comprising the strip electrodes parallel to the second direction, and is provided with a sub-pixel electrode.

* * * * *